(12) United States Patent
Perry et al.

(10) Patent No.: US 6,256,205 B1
(45) Date of Patent: Jul. 3, 2001

(54) FASTENERLESS CARD CAGE FOR CIRCUIT CARDS

(75) Inventors: Joseph C. Perry, Colleyville; Jason S. Allen, Watauga, both of TX (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/474,640

(22) Filed: Dec. 29, 1999

(51) Int. Cl.$^7$ ........................................ H05K 5/00
(52) U.S. Cl. .................. 361/753; 361/752; 361/796; 361/802; 211/41.17
(58) Field of Search .................... 361/752, 753, 361/796–797, 788, 802; 211/41.17

(56) References Cited

U.S. PATENT DOCUMENTS

| | | | |
|---|---|---|---|
| 4,672,510 | * | 6/1987 | Castner ................................ 361/415 |
| 5,027,254 | * | 6/1991 | Corfits et al. ....................... 361/384 |
| 5,313,369 | * | 5/1994 | Lewis et al. ........................ 361/796 |
| 5,892,662 | * | 4/1999 | Verma ................................. 361/796 |
| 5,995,377 | * | 11/1999 | Tusler et al. ....................... 361/796 |

* cited by examiner

*Primary Examiner*—Jayprakash N. Gandhi
*Assistant Examiner*—Tuan Dinh
(74) *Attorney, Agent, or Firm*—Jones, Day, Reavis & Pogue

(57) ABSTRACT

A card cage for supporting an array of printed circuit cards and permitting connection of the cards to a backplane includes an upper guide plate integrally formed with opposed downwardly extending sides and a lower guide plate integrally formed with opposed upwardly extending sides. The sides of the upper and lower guide plates are provided with latch members for connecting the guide plates together. When the two guide plates are assembled, a backplane is connectable thereto also using latch members. In addition, two or more assembled card cages may be stacked vertically an also connected by latch members. Thus a completely fastenerless card cage system is made possible. Moreover, the card cage may be molded from a suitable thermoplastic material having superior resistance to corrosive environments.

7 Claims, 8 Drawing Sheets

FASTENERLESS CARD CAGE FOR CIRCUIT CARDS

BACKGROUND OF THE INVENTION

1. Field of the Invention

The present invention relates generally to a card cage used to support printed circuit cards particularly in telecommunications equipment such as optical network units and, more specifically, to a card cage that is readily manufacturable and convenient to assemble without the use of fasteners or tools.

2. Description of the Related Art

Telecommunications equipment of various types including optical network units, for example, have long been designed to use printed circuit cards to accomplish various electronic functions. Typically, the cards are supported in guides formed in a cage in side-by-side relation and establish electrical communication through suitable connectors mounted on a backplane assembly. The cage is often open to the front to permit the cards to be conveniently removed and replaced as desired.

The panels from which card cages are assembled have traditionally been fabricated most commonly from sheet metal such as aluminum, cold rolled steel and stainless steel. The metal is stamped and bent into the designed panel configurations then secured together by fasteners such as metal screws, nuts and bolt, rivets and spot welding. Assembly of such card cages, however, is relatively time consuming. A given fastening operation, for example, typically involves the requirement of several fasteners to construct a rigid cage assembly, which can be a relatively slow construction process.

Sheet metal has, in the past, been a material of choice for card cages because of its cost advantages over other suitable metals. However, sheet metal is susceptible to corrosion particularly when used in environments that are not climate controlled. Moreover, corrosion can be exacerbated by galvanic reactions between the card cage material and the fasteners, which typically are made of dissimilar metals. Coatings can be applied to protect the sheet metal from corrosion. However, such coatings may be damaged as fasteners are installed. On the other hand, if a protective coating is applied after the panels are assembled, it may be difficult to coat all surfaces of the panels.

It also will be appreciated that shipping of card cages is made more costly because of their relatively large bulk in comparison to their weight. Thus, it may be desirable in some applications to ship panels in an unassembled state for assembly at a local distribution center or at the site where the card cage will be installed. However, such off-site assembly may still not be a cost-effective alternative because of the time and expense of the assembly operation.

Accordingly, it is desirable to provide a card cage that is capable of assembly without the need for fasteners or tools of any kind. It is further desirable to provide such a card cage which is resistant to corrosive environments. Still further, it is desirable to provide such a card cage which is cost-effective to manufacture.

SUMMARY OF THE INVENTION

The present invention improves over the prior art by providing a card cage for supporting an array of printed circuit cards and permitting connection of the cards to a backplane wherein the card cage includes an upper guide plate integrally formed with opposed downwardly extending sides and a lower guide plate integrally formed with opposed upwardly extending sides. The sides of the upper and lower guide plates are provided with latch members for connecting the guide plates together. When the two guide plates are assembled, a backplane is connectable thereto also using latch members. In addition, two or more assembled card cages may be stacked vertically and also connected by latch members. Thus a completely fastenerless card cage system is made possible. Moreover, the card cage may be molded from a suitable thermoplastic material having superior resistance to corrosive environments.

BRIEF DESCRIPTION OF THE DRAWINGS

The foregoing and other features and advantages of the invention will be better understood upon a reading of the following detailed description taken in conjunction with the accompanying drawings wherein.

DETAILED DESCRIPTION OF THE PREFERRED EMBODIMENT

Figure 1:
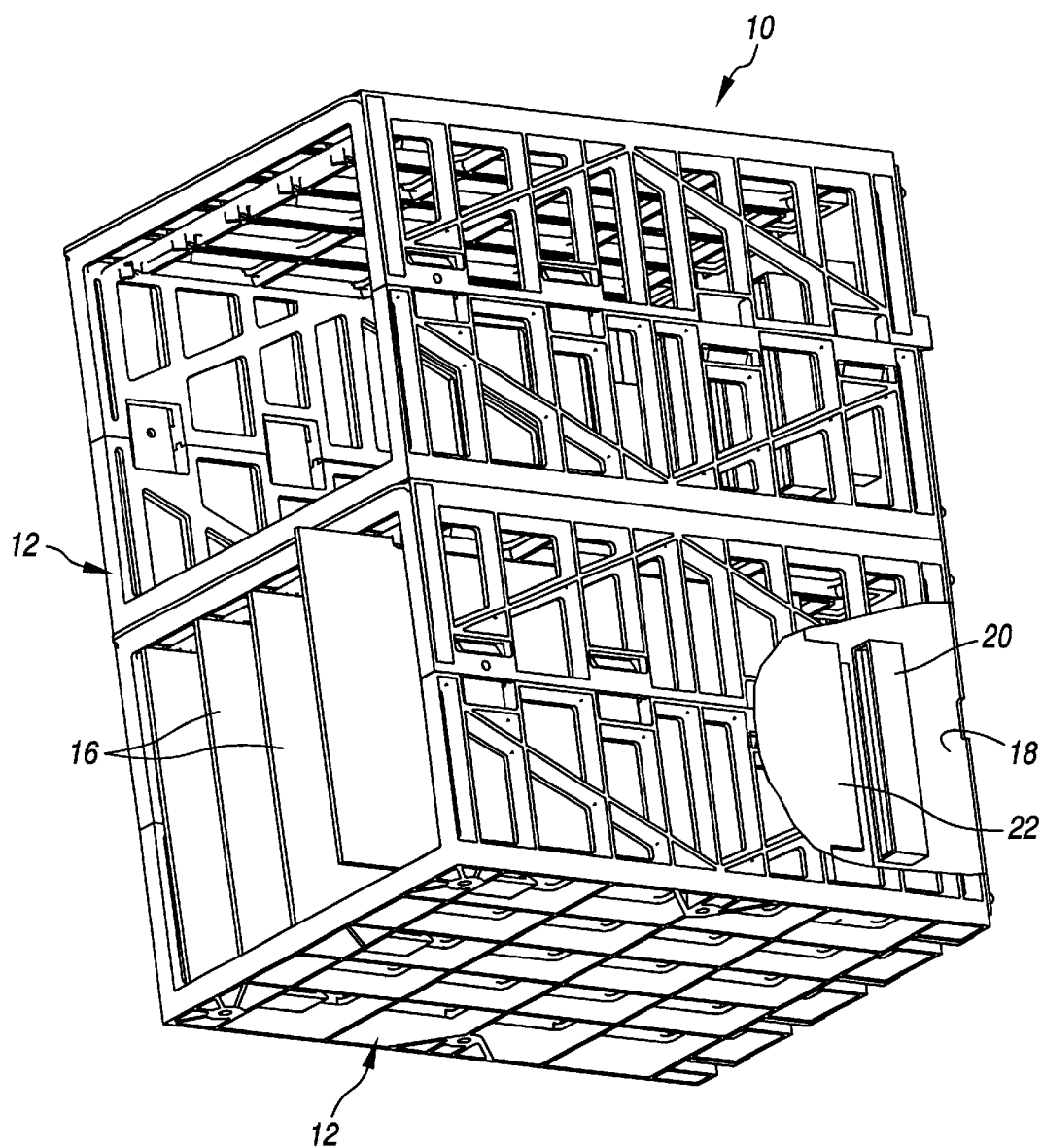
FIG. 1 is a front side perspective view, partially broken away, of an assembly of card cages constructed in accordance with the principles of the invention.

Referring now to the drawings, and initially to FIG. 1, an assembly of two card cages constructed according to the invention is designated generally by the reference numeral 10 and includes an upper card cage and a lower card cage, both designated 12. The card cages 12 are dimensioned and configured to receive and support a plurality of conventional printed circuit cards 16. The rear of the assembly 10 is closed by a printed circuit board backplane 18 to which edge connectors 20 are fixed, only one of which can be seen in FIG. 1. The edge connectors 20 in a manner well-known in the art form electrical connections with rear edges 22 of the circuit cards 16.

Figure 2:
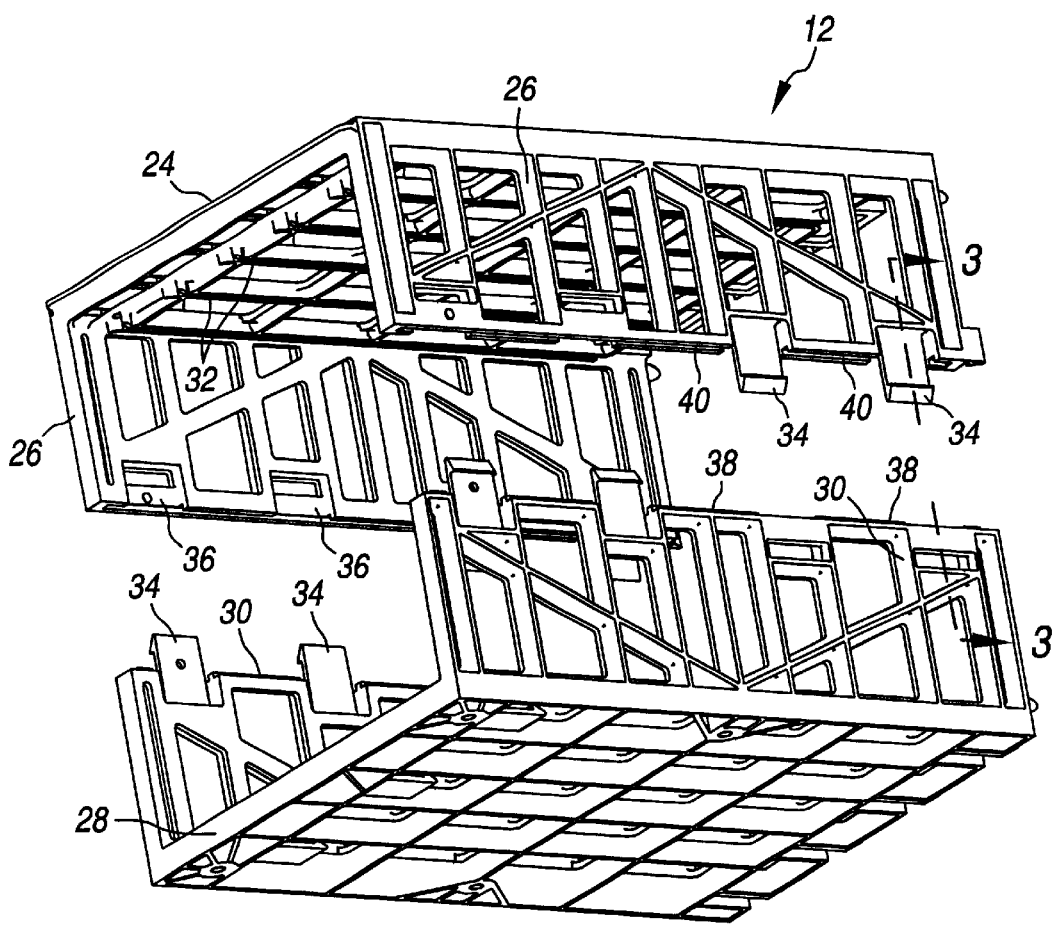
FIG. 2 is a front side exploded perspective view of one of the card cages illustrated in FIG. 1, FIGS. 3A–3C are cross-sectional views taken substantially along the line 3—3 of FIG. 2 and illustrating the function of the latch system for connecting the upper and lower guide plates of the card cage.

Turning to FIG. 2, an exploded view of one of the card cages 12 can be seen. The illustrated card cage includes two components each integrally molded from a suitable thermoplastic material. The components consist of an upper guide plate 24 having downwardly extending side portions 26, and a lower guide plate 28 having upwardly extending side portions 30. Both guide plates 24 and 28 are provided with internal, mutually aligned elongated guide members 32 for receiving and aligning the printed circuit cards 16. In preferred form the guide plates 24 and 28 are molded with an open truss configuration to conserve material, avoid undesirable shrinkage after molding, and to allow ventilation for cooling. In accordance with the invention the side portions 26 and 30 are provided with latch tabs 34 that are received by sockets 36 as will be described in detail hereinafter. The upper edges of the lower side portions 30 are also provided with tongue segments 38 while the lower edges of the upper side portions 26 are provided with corresponding groove segments 40. This tongue and groove arrangement assures proper alignment and resistance against horizontal shifting of the upper and lower guide plates 24 and 28.

Figure 3A:
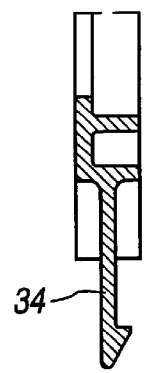
Figure 3A:
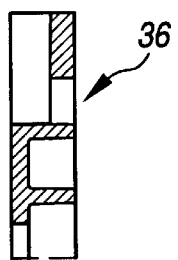
Figure 3B:
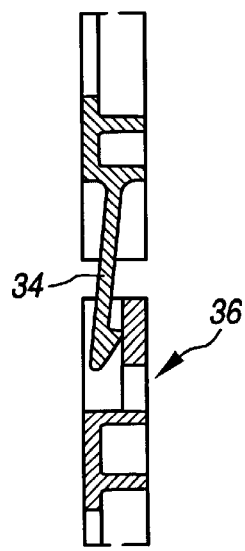
Figure 3C:
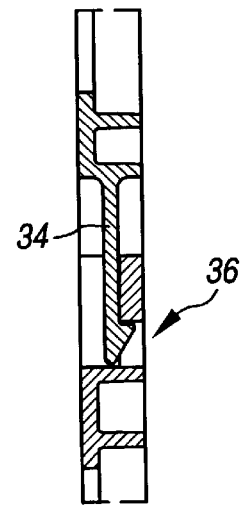

FIGS. 3A–3C illustrate in cross-section the function of the latch tabs 34 as they are inserted into respective aligned sockets 36. It will be appreciated that the tabs 34 are sufficiently resilient to bend, as shown in FIG. 3B, to snap into the sockets 36 and thereafter firmly hold the upper and lower guide plates 24 and 28 together. This latching system thus prevents vertical separation of the guide plates 24 and 28 as well as any shifting thereof from front to rear.

Figure 4:
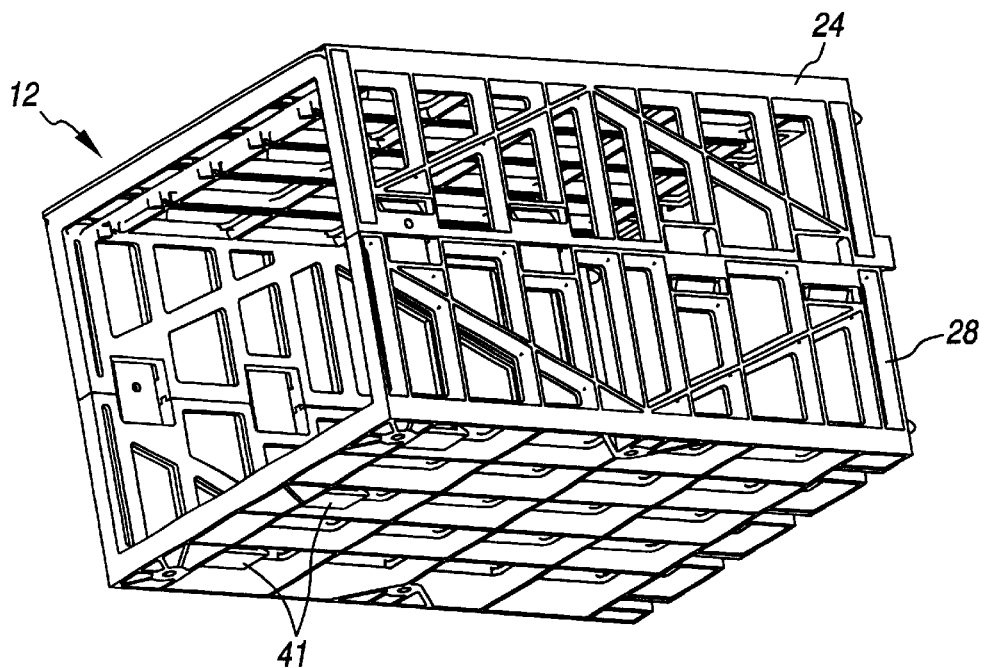
FIG. 4 is an exploded front side perspective view of two assembled card cages.
Figure 4:
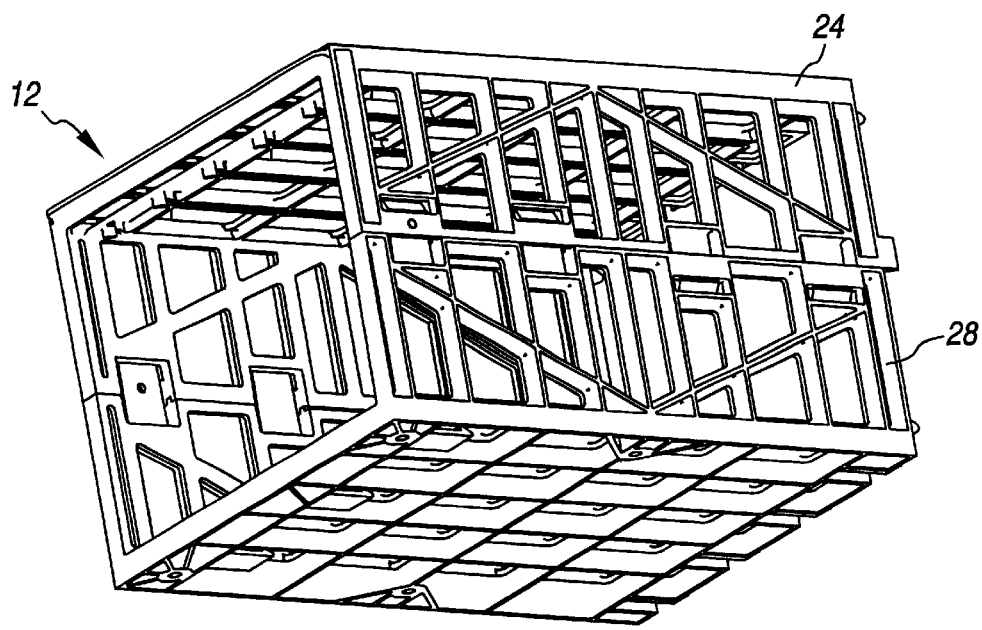
Figure 5:
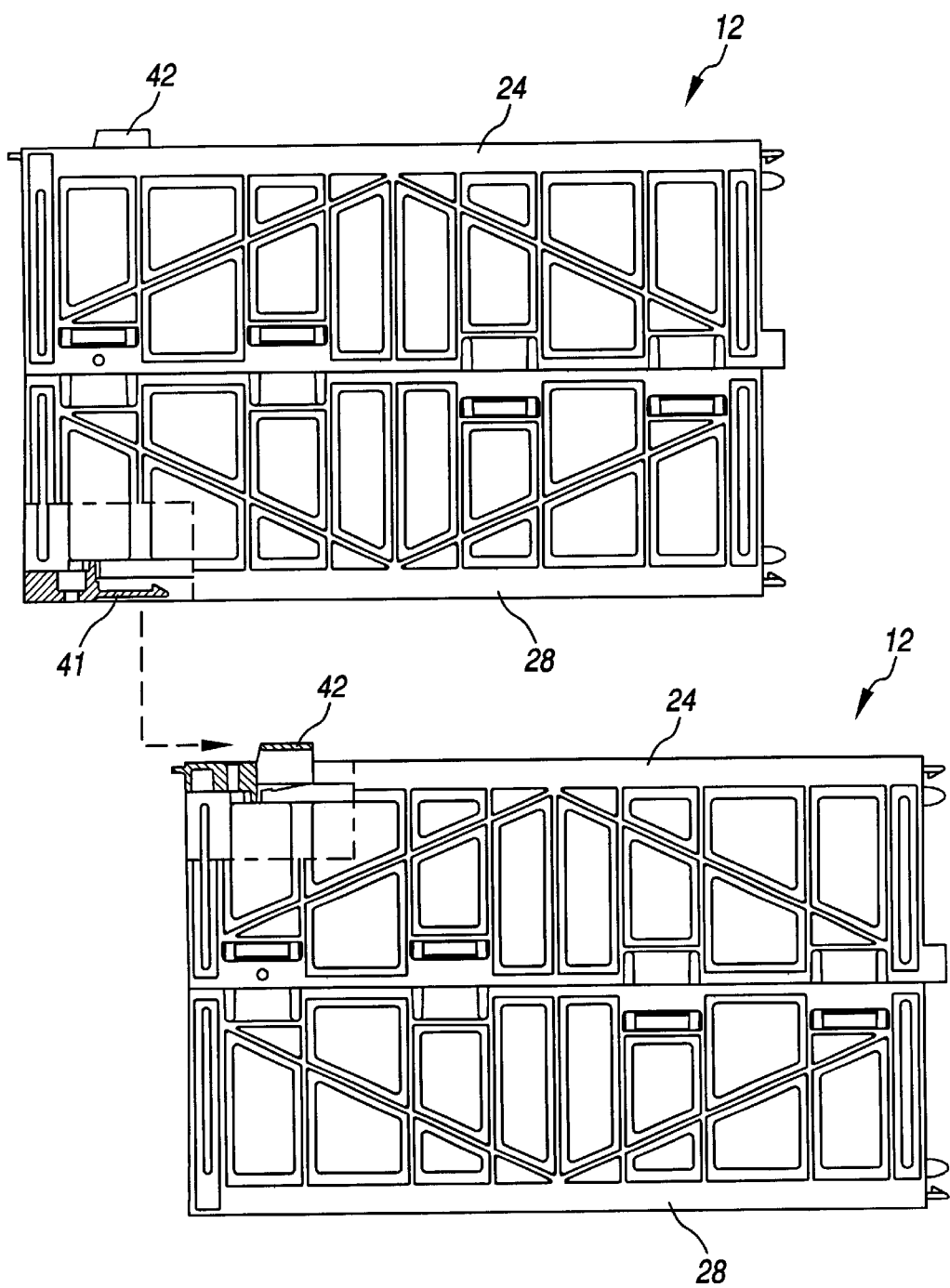
FIG. 5 is a side view, partially in section showing the latching system for multiple stacked card cages.
Figure 6A:
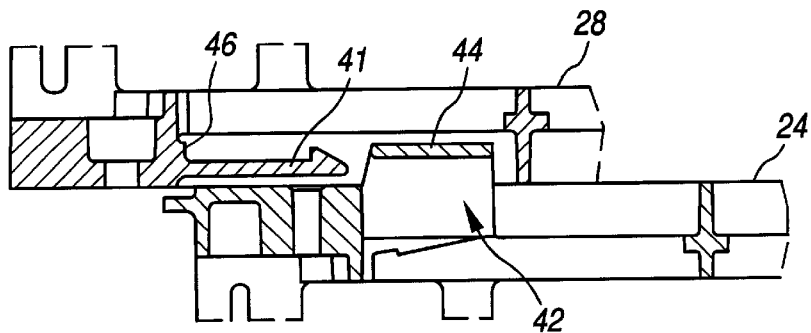
FIGS. 6A–6C illustrate in cross-section the function of the latching system for connecting multiple stacked card cages.
Figure 6B:
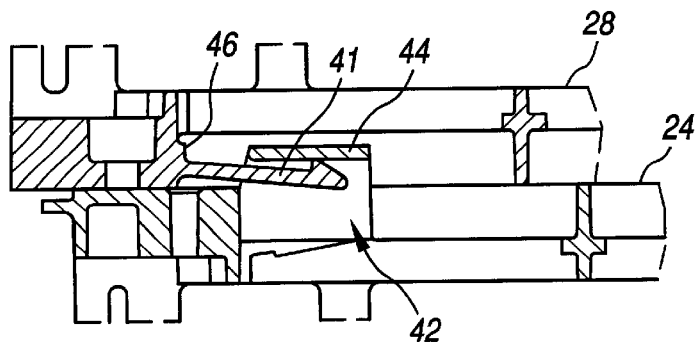
Figure 6C:
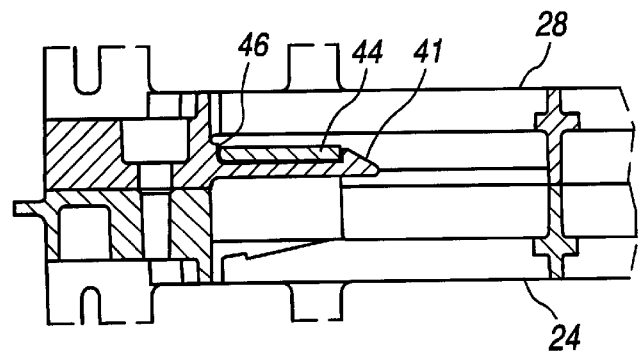

In FIGS. 4 and 5 another feature of the invention is illustrated where it is desired to stack multiple card cages 12 as shown in FIG. 1. The lower side of the lower guide plate 28 is provided with a series of latch tabs 41 which are received by corresponding sockets 42 formed on the upper side of the upper guide plate 24. FIGS. 6A–6C illustrate the function of the latch tabs 41 wherein the tabs 41 bend as shown in FIG. 6B upon insertion into respective sockets 42 whereupon a U-shaped portion 44 of each socket 42 abuts a stop portion 46 of the lower guide plate 28 and the tab 40 latches at a point wherein the upper and lower card cages 12 are in vertical registry (FIG. 6C).

Figure 7:
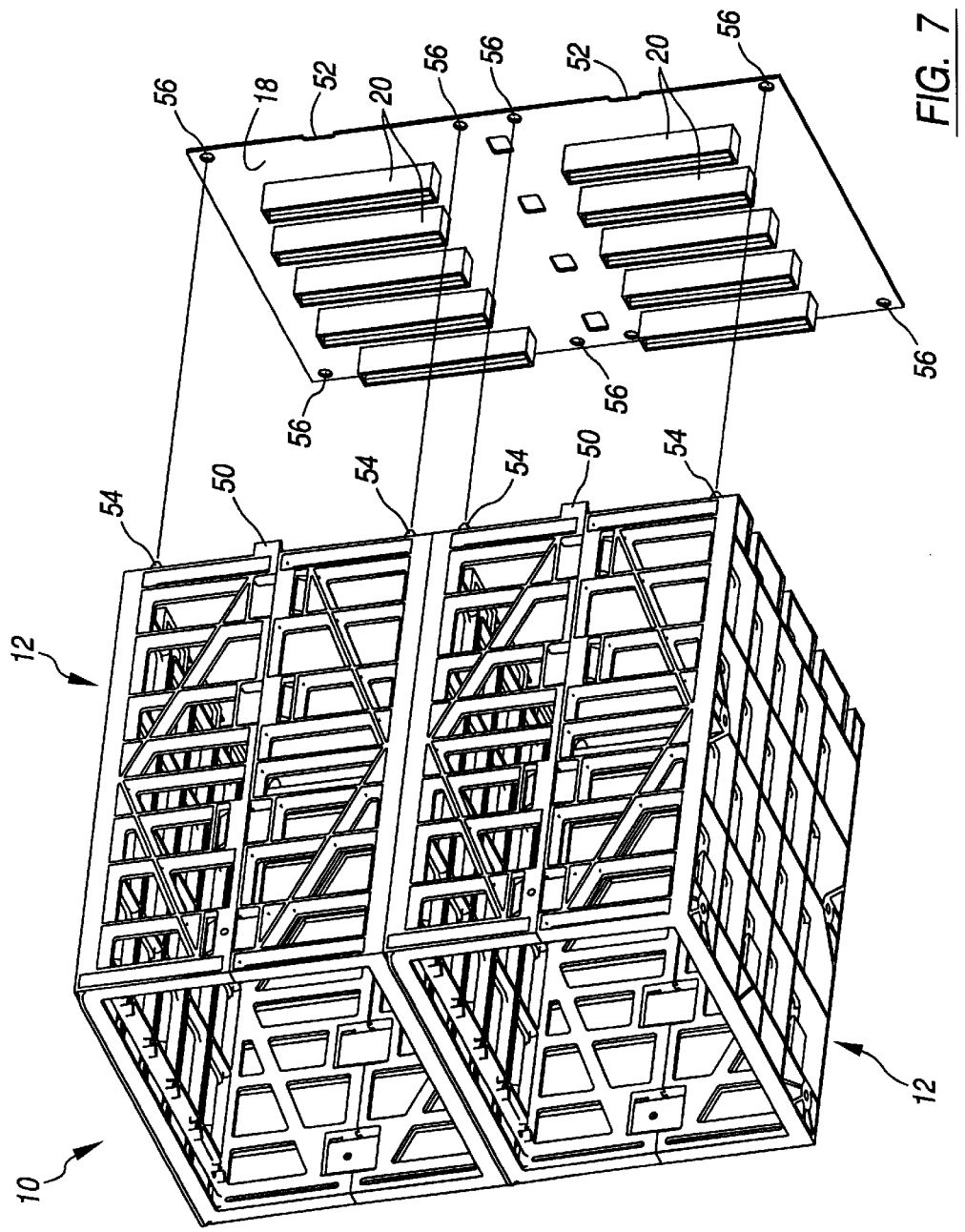
FIG. 7 is a front side exploded perspective view of two stacked card cages and an associated backplane.
Figure 8A:
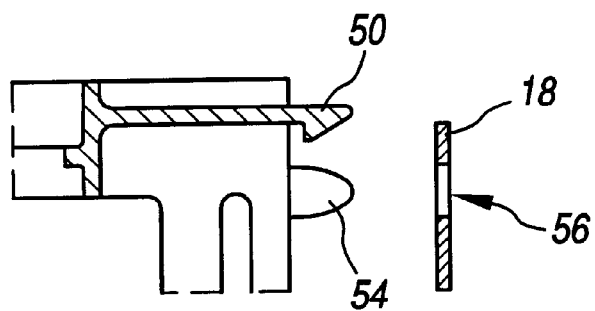
FIGS. 8A–8C illustrate in cross-section the function of the latching system for the backplane.
Figure 8B:
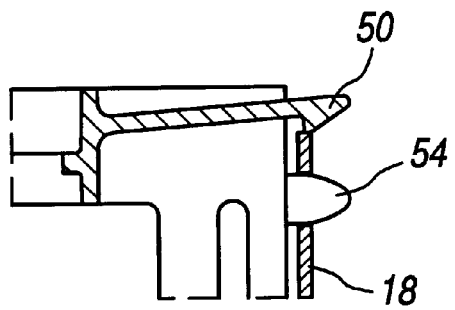
Figure 8C:
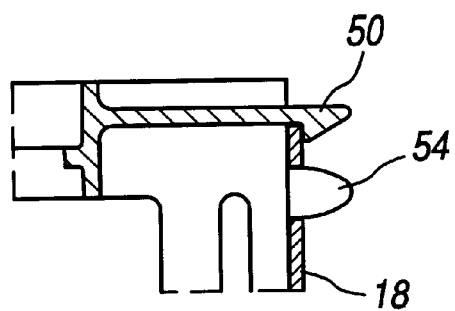

Referring now to FIG. 7 a pair of assembled card cages 12 is illustrated with the backplane 18 shown separate and having multiple edge connectors 20 fixed thereto. In accordance with the invention, the backplane 18 is attachable to the card cages 12 by yet another latch system comprising tabs 50 which engage edge portions 52 of the backplane 18. In addition, to properly locate the backplane 18 in its assembled condition and prevent vertical movement of the backplane, the card cages 12 are provided with integrally formed pins 54 which are received by suitably dimensioned apertures 56 provided in the backplane (FIGS. 8A–8C). Thus, the backplane 18 is readily installed on one or more card cages 12 by snapping it in place with the pins 54 aligned with the apertures 56.

It can now be appreciated that a card cage 12 constructed according to the invention offers considerable advantages over prior art card cages which are fabricated using individual panels that require fastening means such as rivets, nuts and bolts and spot welds. Each guide plate 24 and 28 is readily formed as an integral member to include the above discussed latch arrangements, and thereby the plates 24 and 28 simply snap together without the need for fasteners of any kind. The latch means system for stacking the present card cages 12 is also a highly effective means of tailoring the size of the assembly 10 to meet the particular needs of the installation. Moreover, the latch system for the backplane 18 makes the entire assembly 10 essentially fastenerless. Further, the thermoplastic construction of the card cage 12 allows the card cage 12 to be installed in environments that would otherwise be corrosive to conventional metal cages.

While the invention has been described in connection with a preferred embodiment thereof, it will be apparent to those skilled in the art that many changes and modifications may be made without departing from the true spirit and scope of the present invention. Accordingly, it is intended by the appended claims to cover all such changes and modifications as come within the spirit and scope of the invention.

What is claimed is:

1. A card cage for supporting an array of printed circuit cards and permitting connection of the cards to a back plane, comprising:

an upper guide plate having a top side integrally formed with opposed downwardly extending sides;

a lower guide plate having a bottom side integrally formed with opposed upwardly extending sides;

latch means cooperating between the downwardly extending sides of the upper guide plate and the upwardly extending sides of the lower guide plate for connecting the guide plates together and retaining them in fixed disposition; and latch means cooperable between the top side of said upper guide plate and the bottom side of said lower guide plate wherein multiple card cages can be stacked one on top of another and latched together without the need for fasteners;

wherein the sides of the upper and lower guide plates are provided with cooperating tongue and groove means for alignment of the sides of said guide plates and the prevention of horizontal movement between the guide plates.

2. The card cage of claim 1 wherein the upper and lower guide plates comprise integrally formed mutually aligned guide members for receiving and supporting printed circuit cards, the guide members, being integrally formed with the guide plates to insure accurate alignment of printed circuit cards with respective mating backplane connectors.

3. The card cage of claim 1 wherein the guide plates are provided with latch means cooperating with said backplane for securing said backplane to said card cage.

4. The card cage of claim 1 wherein the guide plates are provided with pins cooperating with said backplane to align said backplane in fixed disposition on said card cage and prevent vertical movement of the backplane.

5. An assembly of multiple card cages for supporting arrays of printed cards and permitting connection of the cards to a back plane, comprising:

an upper card cage including an upper guide plate and a lower guide plate;

a lower card cage including an upper guide plate and a lower guide plate; and latch means cooperating between said upper and lower card cages to retain said card cages in stacked relation without the need for fasteners;

wherein said card cages have sides extending downwardly from said upper guide plate and sides extending upwardly from said lower guide plate and said downwardly extending and upwardly extending sides are mateable with tongue and groove means.

6. The assembly of claim 5 wherein said backplane is connected to both the upper and lower card cages by latches.

7. The assembly of claim 6 wherein said card cages and backplane are connected together without the use of any fasteners or tools.

* * * * *